United States Patent
Joiner et al.

(10) Patent No.: US 6,933,599 B2
(45) Date of Patent: Aug. 23, 2005

(54) ELECTROMAGNETIC NOISE SHIELDING IN SEMICONDUCTOR PACKAGES USING CAGED INTERCONNECT STRUCTURES

(75) Inventors: Bennett A. Joiner, Austin, TX (US); Yaping Zhou, Austin, TX (US); Ben W. Herberg, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/694,146

(22) Filed: Oct. 27, 2003

(65) Prior Publication Data

US 2005/0087856 A1 Apr. 28, 2005

(51) Int. Cl.[7] .............................................. H01L 23/48
(52) U.S. Cl. ................... 257/690; 257/691; 257/693; 257/773; 257/659; 257/786; 257/784; 257/777; 257/775; 257/776; 257/723; 257/676; 257/774; 257/737; 257/734; 257/728; 439/108
(58) Field of Search ................................. 257/777, 775, 257/773, 776, 723, 676, 774, 737, 734, 728, 659, 690, 691, 693, 786, 784; 439/108

(56) References Cited

U.S. PATENT DOCUMENTS

| | | | |
|---|---|---|---|
| 5,468,999 A | 11/1995 | Lin et al. | |
| 6,160,705 A | 12/2000 | Stearns et al. | |
| 6,242,814 B1 | 6/2001 | Bassett | |
| 6,476,506 B1 * | 11/2002 | O'Connor et al. | 257/786 |
| 6,538,336 B1 | 3/2003 | Secker et al. | |
| 6,692,272 B2 * | 2/2004 | Lemke et al. | 439/108 |
| 2003/0080357 A1 * | 5/2003 | Tsai et al. | 257/203 |

* cited by examiner

*Primary Examiner*—Eddie Lee
*Assistant Examiner*—Junghwa Im
(74) *Attorney, Agent, or Firm*—Robert L. King; Michael P. Noonan

(57) ABSTRACT

A semiconductor device has a die (10) overlying and electrically connected to a support structure (11), such as a substrate or a lead frame, via a plurality of interconnects. Aggressor interconnects (32, 38) are noise sources to victim interconnects (29, 59) carrying sensitive signals. An arrangement of shield interconnects (51–58) surround the victim interconnect (29, 59) in a cage-like structure to significantly block noise from the aggressor interconnect. In one form the shield interconnects are ground or power supply and the victim interconnect may be, for example, a clock signal or an RF signal. The number of shield interconnects and the number of protected victim interconnects varies depending upon design requirements. Either wire bonding or other interconnect technology (e.g. bump) is applicable.

12 Claims, 2 Drawing Sheets

ELECTROMAGNETIC NOISE SHIELDING IN SEMICONDUCTOR PACKAGES USING CAGED INTERCONNECT STRUCTURES

CROSS-REFERENCE TO RELATED APPLICATION

This application is related to U.S. patent application Ser. No. 10/457,632, filed on Jun. 9, 2003, entitled "Semiconductor Package Having Optimized Wire Bond Positioning," naming Robert J. Wenzel and Peter R. Harper as inventors, and assigned to the assignee hereof.

BACKGROUND

1. Field

The present invention relates to electromagnetic noise shielding, and, more particularly, to noise shielding in semiconductor packages.

2. Description of the Related Art

Management of degradation of signals due to crosstalk noise is a ubiquitous engineering challenge. For example, in semiconductor packages including wires coupling a semiconductor die to a substrate, an electrical signal traveling down a wire may be distorted by noise being added by inductive and capacitive coupling with other nearby signal wires. Crosstalk noise can often be an order of magnitude greater than noise introduced by circuit traces in the substrate. Wireless devices can be especially susceptible to such noise due to the frequencies of signals involved. Wireless devices such as cell phones, base band processors, blue tooth devices, and other devices dependent upon semiconductor packages would benefit by additional techniques for reducing these noise effects.

BRIEF DESCRIPTION OF THE DRAWINGS

The present invention may be better understood, and its numerous objects, features, and advantages made apparent to those skilled in the art, by referencing the accompanying drawings.

The use of the same reference symbols in different drawings indicates similar or identical items. Skilled artisans will appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE PREFERRED EMBODIMENT(S)

The following discussion is intended to provide a detailed description of at least one example of the invention and should not be taken to be limiting of the invention itself. Rather, any number of variations may fall within the scope of the invention which is properly defined in the claims following this description.

Figure 1:
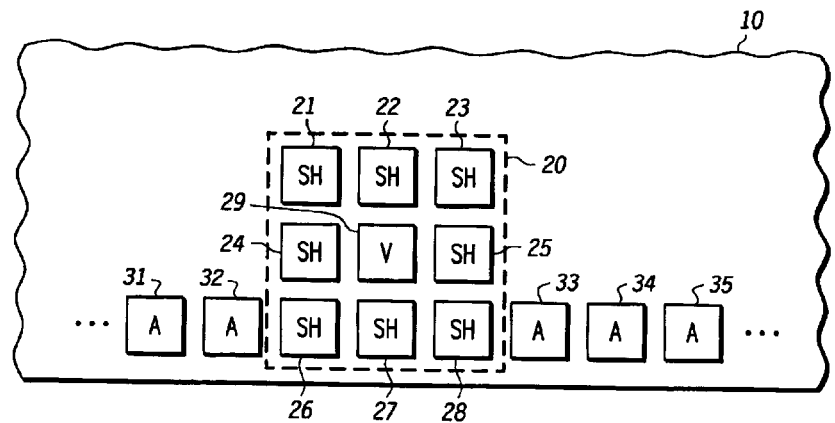
FIG. 1 is a block diagram illustrating one embodiment of interconnect pads on a semiconductor die in accordance with the invention.

FIG. 1 shows a semiconductor die 10 including a variety of interconnect pads 21–35. When semiconductor die 10 is operational, interconnect pads 21–35 will have been coupled to various interconnect structures (see, e.g., wires 51–59 and 38 of FIG. 2) for communicating signals to and from semiconductor die 10. Pads 21–35 may be any type of traditional or innovative semiconductor die interconnect pads. Three types of electrical assignments of the interconnect pads are shown in FIG. 1. The type of each pad assignment (and consequently the interconnect connected to each pad) is determined by the signal to be carried by the pad and its corresponding interconnect. Pads 21–35 include aggressor (A) pads 31, 32, 33, 34 and 35, victim (V) pad 29 and shield (SH) pads 21, 22, 23, 24, 25, 26, 27 and 28. As shown, shield pads 21–28 are interposed between victim pad 29 and aggressor pads 31–35, and shield pads 21–28 surround victim pad 29.

Figure 2:
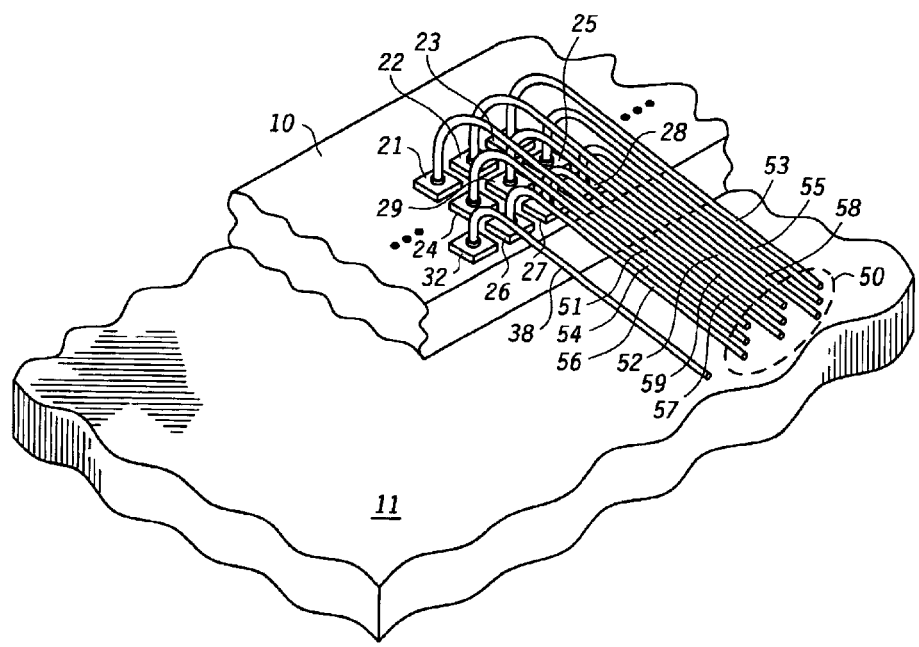
FIG. 2 is a perspective diagram illustrating the semiconductor die of FIG. 1 coupled to a substrate with wire interconnects in accordance with the invention.

FIG. 2 shows semiconductor die 10 coupled to substrate 11. Substrate 11 is representative of any support structure which provides interconnect from the die-to-substrate interconnect to the exterior of the package. Examples of such support structures including ceramic package substrates, plastic laminate substrates and lead frame packages. Examples of the aforementioned die-to-substrate interconnect include bond wires, solder columns and flip chip bumps.

In the embodiment shown, semiconductor die 10 is electrically connected to elements of substrate 11 via bond wire interconnect structures 38 and 51–59. In this context, connected means coupled directly or through another metal or other material for transferring signals or electrical information. Each of the interconnects, in this case wires 38 and 51–59, couple to respective ones of pads 32 and 21–29 and to corresponding pads (not shown) on substrate 11. Although wires 38 and 51–59 are coupled to substrate 11, such coupling is not shown so as to more clearly illustrate the shield cage configuration discussed below and illustrated in part at interrupted wire edges 50 of wires 51–59 discussed below.

Referring to both FIGS. 1 and 2, interconnect pads 31–35 are coupled to carry signals such as I/O signals. The signals carried by interconnect pads 31–35 (and therefore by corresponding wires coupled to interconnect pads 31–35 such as wire 38) are relatively noisy signals and are therefore referred to herein as aggressor signals. The exemplary aggressor signals may be, for example, digital I/O signals. Interconnect pads 31–35 carry the aggressor signals and are therefore designated as aggressor pads, and the interconnects coupled to interconnect pads 31–35 (e.g., wire 38) are designated as aggressor interconnects (in the presently discussed embodiment, aggressor wires).

Pad 29 and wire 59 are coupled to carry a relatively noise-sensitive signal such as an RF signal, a PLL supply signal, or another signal which has a level of sensitivity to noise which may be of concern. Since noise sensitive signals are often referred to as victims or victim signals, pad 29 and wire 59 are designated as the victim pad and victim wire in the present discussion.

Because the signals carried by the victim interconnect structure (victim pad 29 and victim wire 59) are susceptible to noise, shield pads 21–28 are provided on semiconductor die 10 to provide pads for corresponding shield interconnects 51–58. Shield pads 21–28 are provided as a part of a pad shield cage 20. Shield cage 20 physically surrounds victim interconnect pad 29. Since shield cage 20 includes a number of shield pads with spaces disposed therebetween, shield cage 20 may be conceived of as providing an interrupted shield surface or area around a periphery of victim pad 29. Shield cage 20 somewhat physically encases victim interconnect pad 29 so that during operation shield cage 20 effectively (to a predetermined relevant degree) electromagnetically shields victim interconnect pad 29. Shield pads 21–28 are coupled to shield interconnects 51–58 which similarly encase and shield victim interconnect 59.

The pads of die 10 are located so that victim pads are shielded to a desired degree from the noise of aggressor pads by shield pads. For example, in the illustrated embodiment, eight shield interconnect pads 21–28 are positioned near victim interconnect pad 29, at least some of which are generally closer to victim interconnect pad 29 than other pads corresponding to noise sources. Victim pad 29 is effectively surrounded by shield pads 21–28 to provide a shield cage. The shield and victim pads are arranged in a 3×3 array configuration with the victim signal V in the middle location of the array and shield signals SH on the periphery of the array. Such a configuration aids the shield interconnects 51–58 which are coupled to shield pads 21–28 to be similarly positioned around the victim interconnect 59 which is coupled to victim pad 29. The encasing configuration of the shield wires 51–58 around victim wire 59 is shown at the interrupted edges 50 of wires 51–59.

This interconnect pad configuration on the semiconductor die and among the wire interconnects (and on the substrate to which the die is coupled via the interconnect) are placed to support isolation of the signal from crosstalk noise from other interconnect structures. In the presently discussed embodiment, the shield interconnect wires 51–58 surround the victim signal interconnect wire 59 to shield it from crosstalk noise from aggressor wire 38. Thus, the configuration of the shield wires 51–58 around victim wire 59 is similar to the configuration of the shield pads 21–28 around victim pad 29. Crosstalk noise from noisy or aggressor signals can affect noise sensitive or victim signals by being electromagnetically coupled between the wires of a wire interconnect structure. By spacing wire bond pads in the manner illustrated, the wires are more easily maintained in a similar shield configuration around the victim signal wire throughout the length of the victim signal wire extending between the semiconductor die and the substrate.

The presently discussed embodiment includes eight shield structures, and simulations of one such embodiment using 1 mil wires indicated a 15 dB improvement at 2 GHz. Other embodiments may use more or fewer shield pads and interconnects in different spatial configurations depending on various factors including the sensitivity of the victim signal to noise and the technology available to manufacture and package the semiconductor die. Other spatial configurations with different numbers of shield pads and wires are discussed herein with reference to at least FIGS. 3–5.

Shield interconnect pads 21–28 are coupled to circuit nodes useful for noise shielding. For example, shield pads 21–28 may be coupled to any type of slowly varying (e.g., having a rise and/or fall time at least 10 times longer than that of an aggressor signal) and low impedance node or signal, preferably to a supply node such as a power node or a ground node. All of the shield pads may be coupled to the same shield node to be held at the same potential, or to different shield nodes. In one embodiment, the victim signal is a single ended output referenced to two supply nodes, and both supply nodes are coupled so as to be interspersed in the shield cage 20. For example, pads 21, 23, 26 and 28 are coupled to the power node and pads 22, 24, 26 and 27 are coupled to the ground nodes. In another embodiment, the victim signal V is referenced to ground, and the shield pads are coupled to the ground node. In another embodiment, the victim signal V is an input signal referenced from a power node, and the shield pads are coupled to the power node. In another embodiment, the victim signal V is differential, and various ones of shield pads 21–28 are coupled to a power node and various other ones of pads 21–28 are coupled to a ground node. The potentials carried by the shield pads and interconnects can vary depending on the characteristics of the victim signal V.

Figure 3:
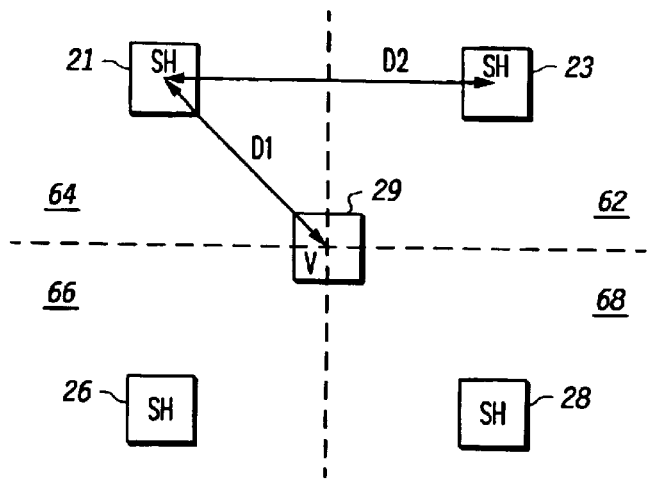
FIG. 3 is a graph illustrating another embodiment in which shield structures are placed in each of four quadrants around a victim signal carrying structure.

FIG. 3 is a graph illustrating an embodiment in which four shield structures (pad and wire, at locations indicated by pads 21, 23, 26 and 28) are used. As shown, a plane orthogonal to the flow of the noise sensitive signal V through pad 29 and wire 59 is partitioned into four equal regions or quadrants 62, 64, 66 and 68. One shield structure (pad and wire) is placed in each of the four quadrants around a victim signal carrying structure (pad 29 and wire 59). A shield pad and wire may be placed at various points around the victim signal V to shield the victim signal from aggressor signals.

Various techniques may be used to locate the shield structures. For example, the four shield structures may be non-uniformly placed within each quadrant (e.g., to provide any tetragon-shaped configuration), but it may be preferable to place them using a more uniform distribution such as that shown. The four shield structures may be placed substantially equidistantly from the victim pad/wire, one in each quadrant. The structures may be placed at around 90° intervals to provide a substantially square-shaped configuration. It may also be desirable to locate such shield pads and wires so that the distance D1 from each shield pad/wire to the victim pad/wire is minimized to promote more effective shielding. Alternately, the shield pads and wires may be located such that the distance D2 between each of the shield pads and wires is minimized, or located substantially uniformly (e.g., so that the deviation from an average distance between the shield pads and wires is minimized) to promote more uniform shielding.

Figure 4:
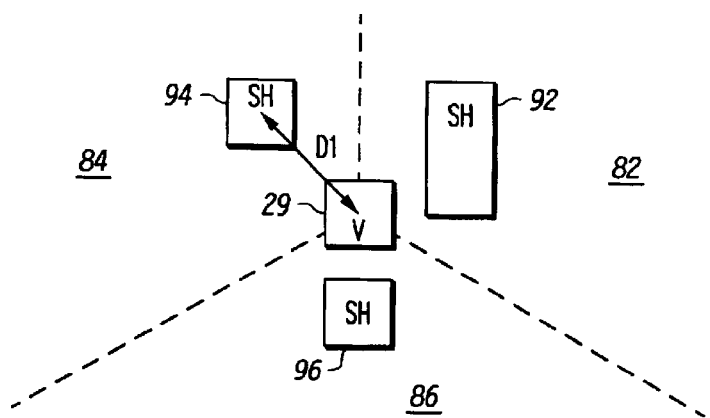
FIG. 4 is a graph illustrating another embodiment in which shield structures are placed in each of three regions around a victim signal carrying structure.

FIG. 4 is a graph illustrating another embodiment in which three shield structures 92, 94, and 96 are used. As shown, a plane orthogonal to the flow of the noise sensitive signal V through pad 29 and wire 59 is partitioned into three equal regions 82, 84 and 86. One shield structure is placed in each of the three regions around the victim signal carrying structure. A shield pad and wire may be placed at various points around the victim signal V to shield the victim signal from aggressor signals. For example, the three shield pads/wires may be placed substantially equidistantly from the victim pad/wire, one in each region, in this case at around 120° intervals to provide a substantially equilateral-triangle-shaped configuration around the victim signal carrying structure. Such shield pads and wires may be flexibly and non-uniformly placed within each region (e.g., to provide any triangle-shaped configuration). It may also be desirable to locate such shield pads and wires so that the distance D1 from each shield pad/wire to the victim pad/wire is minimized to maximize the amount of shielding provided to the victim signal.

As shown in FIG. 4, the pads may have an irregular shape. For example, pad 92 may be elongated to provide for ease in probing the pad 92 during testing of semiconductor die 10. The wires may be connected to the pads at any appropriate location on the pad so that irregularities in pad size and shape will not substantially affect the wire locations and therefore the shielding provided by the shield wires.

Figure 5:
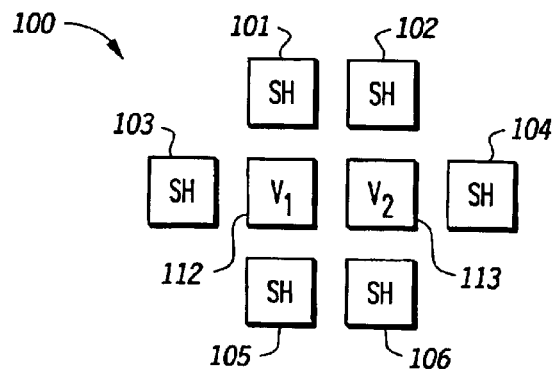
FIG. 5 is a graph illustrating another embodiment in which shield structures are placed around a differential victim signal carrying structure.

FIG. 5 is a graph illustrating another embodiment in which shield structures are placed around a differential victim signal carrying structure. Shield cage 100 includes shield pad/wire structures 101, 102, 103, 104, 105 and 106 disposed around a differential victim signal carrying structure. The differential signal includes two signal components $V_1$ and $V_2$ carried by pads/wires 112,113 respectively. Signal components $V_1$ and $V_2$ could carry a traditional differential data, clock, control or other signals, or even PLL power and ground signals.

Many advantages of the teachings herein may be realized in a variety of embodiments. For example, in one embodiment, a semiconductor package includes a semiconductor die having a plurality of interconnect pads positioned thereon. At least one group of the interconnect pads includes a victim interconnect pad and shield interconnect pads. Signals carried by the victim interconnect pad are susceptible to noise from surrounding signals. The shield interconnect pads function as shields to the victim interconnect pad. At least three or at least four of the shield interconnect pads are positioned near the victim interconnect pad closer to the victim interconnect pad than other noise sources external to the semiconductor die. The at least three or four shield interconnect pads form a noise shield within a periphery of the victim interconnect pad. Each of the at least three or four of the shield interconnect pads may provide an interconnect for ground or power.

In another further embodiment, the shield interconnect pads functioning as shields include four interconnect shield pads that are respectively positioned in each of four quadrants surrounding the victim interconnect pad. Each of the four interconnect shield pads may positioned a predetermined distance from a center of the victim interconnect pad and substantially at each corner of a square centered on the victim interconnect pad.

In another further embodiment, the semiconductor package includes a bond wire connected to each of the victim interconnect pad and the shield interconnect pads. Each bond wire may be routed to a support structure while maintaining a shield structure around the bond wire connected to the victim interconnect pad. The shield structure may include a physical arrangement of bond wires electrically connected to the shield interconnect pads to form a cage substantially around the bond wire electrically connected to the victim interconnect pad, and the bond wires may be electrically connected to the shield interconnect pads and may be closer to the bond wire electrically connected to the victim interconnect pad than other noise sources radiating from bond wires of the semiconductor package.

In another further embodiment, the victim interconnect pad further comprises two victim interconnect pads positioned adjacent to each other and surrounded by the shield interconnect pads. The two victim interconnect pads may conduct a differential signal.

In another further embodiment, a first portion of the plurality of interconnect pads is positioned to a first side of the one group of interconnect pads along a peripheral edge of the semiconductor die and a second portion of the plurality of interconnect pads is positioned to a second side of the one group of interconnect pads along the same peripheral edge of the semiconductor die.

In another further embodiment, the semiconductor package further includes eight interconnect shield pads that are respectively positioned surrounding the victim interconnect pad. The eight interconnect shield pads may be positioned substantially adjacent to each of four sides of the victim interconnect pad and offset from each of four corners of the victim interconnect pad.

In another embodiment, a semiconductor package includes a support structure, a semiconductor die overlying (e.g., proximate to, and overlying in at least one orientation) the support structure, a plurality of interconnects electrically connecting the support structure and the semiconductor die, and at least one shielding group of interconnects. The shielding interconnects electrically shield a predetermined victim interconnect from noise sources. The shielding interconnects include at least three or at least four interconnects radially surrounding a periphery region of the victim interconnect and are positioned closer to the victim interconnect than any of the plurality of interconnects.

In a further embodiment, the at least three interconnects are positioned in each of three radial regions around the victim interconnect, and each of the three radial regions are defined by a one hundred twenty degree angle from a center of the victim interconnect. In another further embodiment, the at least three interconnects further include four interconnects that are respectively positioned in each of four quadrants encompassing a periphery of the victim interconnect. In another further embodiment, the at least four interconnects are positioned such that any closest noise source to the victim interconnect is at least 1.5 times or at least twice a closest bond pad pitch to the victim interconnect. In another further embodiment, the at least three interconnects further include eight interconnects substantially surrounding the periphery of the victim interconnect and are located closer to the victim interconnect than any aggressor interconnect of the semiconductor package. In another further embodiment, each interconnect of the at least one shielding group of interconnects further includes an interconnect pad located on the semiconductor die and a respective connected bonding wire that forms a portion of a bonding wire cage that exists from the semiconductor die to a predetermined site on the support structure. In another further embodiment, the victim interconnect further includes two victim interconnects positioned adjacent to each other and the two victim interconnects are surrounded by each interconnect of the shielding group of interconnects. The two victim interconnects may, for example, conduct a differential signal.

In another embodiment, a method of noise isolation in a semiconductor package is provided. A support structure, a semiconductor die and a plurality of interconnects are provided. The semiconductor die overlies the support structure. The interconnects electrically connect the support structure and the semiconductor die. At least one shielding group of interconnects is provided to electrically shield a predetermined victim interconnect from noise sources. At least three interconnects are positioned radially around a periphery region of the victim interconnect and closer to the victim interconnect than any of the plurality of interconnects.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description. For example, although embodiments using three, four, six and eight shield structures have been shown, any appropriate number of shielding structures greater than two may be used. Also, although triangular, rectangular, tetragonal and hexagonal configurations of shielding structures have been shown, any shaped configuration may be used as appropriate for the shielding needs of the particular embodiment. Also, in general, the use of any specific exemplar herein is also intended to be representative of its class and the noninclusion of any specific devices in any exemplary lists herein should not be taken as indicating that limitation is desired.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. In a semiconductor package comprising a semiconductor die having a plurality of interconnect pads positioned thereon and along an edge thereof and at least one group of interconnect pads, the at least one group of interconnect pads comprising:

a differential pair of victim interconnect pads, each having first, second, third and fourth sides and positioned adjacent to each other along the first sides thereof, each having a second side facing toward the edge and an opposite third side, the fourth side thereof being opposite the first side, the differential pair of victim interconnect pads being configured to carry a signal that is susceptible to noise created by surrounding signals; and six shield interconnect pads functioning as shields to the victim interconnect pad, a first and a second of the shield interconnect pads being respectively offset from the second and third sides of a first of the differential pair of victim interconnect pads, a third and a fourth of the shield interconnect pads being respectively offset from the second and third sides of a second of the differential pair of victim interconnect pads, a fifth of the shield interconnect pads being offset from the fourth side of the first of the differential pair of victim interconnect pads, a sixth of the shield interconnect pads being offset from the fourth side of the second of the differential pair of victim interconnect pads, wherein no additional victim interconnect pads are positioned substantially along diagonals of the differential pair of victim interconnect pads.

2. The semiconductor package of claim 1 wherein each of the six shield interconnect pads is an interconnect for ground or power.

3. The semiconductor package of claim 1 wherein each of the differential pair of victim interconnect pads conducts a signal that is sensitive to noise.

4. The semiconductor package of claim 1 further comprising a plurality of wires, each of which is connected to a respective corresponding one of the differential pair of victim interconnect pads and six shield interconnect pads and extending from the semiconductor die over the edge, the plurality of wires forming a cage to shield signals from the differential pair of victim interconnect pads.

5. The semiconductor package of claim 1 further comprising a bond wire connected to each of the differential pair of victim interconnect pads and the six shield interconnect pads.

6. The semiconductor package of claim 5 wherein each bond wire that is connected to each of the differential pair of victim interconnect pads and the six shield interconnect pads is routed to a support structure while maintaining a shield structure around the bond wire connected to the victim interconnect pad.

7. The semiconductor package of claim 6 wherein the shield structure further comprises a physical arrangement of bond wires electrically connected to the six shield interconnect pads to form a cage substantially around bond wires respectively electrically connected to the differential pair of victim interconnect pads, the bond wires electrically connected to the six shield interconnect pads being closer to the bond wires electrically connected to the differential pair of victim interconnect pads than other noise sources radiating from bond wires of the semiconductor package.

8. The semiconductor package of claim 1 wherein the differential pair of victim interconnect pads respectively conduct power and ground signals.

9. The semiconductor package of claim 1 wherein not all of the shield interconnect pads have a same shape.

10. A semiconductor package comprising:
a support structure;
a semiconductor die overlying the support structure;
a plurality of interconnects electrically connecting the support structure and the semiconductor die; and
a shielding group of interconnect pads on a same level of the semiconductor die that electrically shield a predetermined victim interconnect pad also located on the same level of the semiconductor die from noise sources, the victim interconnect pad having first, second, third and fourth sides, the shielding group of shield interconnect pads comprising eight shield interconnect pads, a respective one of the eight shield interconnect pads being respectively offset from each side of the victim interconnect pad, and a respective one of the eight shield interconnect pads being offset diagonally from each corner of the victim interconnect pad, thereby resulting in three of the eight shield interconnect pads being aligned along an outer edge of the semiconductor die.

11. The semiconductor package of claim 10 wherein each interconnect pad of the shielding group of interconnect pads has a respective connected bonding wire that forms a portion of a bonding wire cage that exists from the semiconductor die to a predetermined site on the support structure.

12. A semiconductor package comprising:
a support structure;
a semiconductor die overlying the support structure and having an edge;
a plurality of interconnects electrically connecting the support structure and the semiconductor die;
a first row of interconnect pads, the first row of interconnect pads being positioned closest to the edge of the semiconductor die and comprising no victim signal interconnect pads;
a second row of interconnect pads, the second row of interconnect pads being centered further away from the edge of the semiconductor die than the first row of interconnect pads and comprising a victim interconnect pad;
a third row of interconnect pads, the third row of interconnect pads being centered further away from the edge of the semiconductor die than either the first row or the second row, each of the first row, the second row and the third row being on a same level of the semiconductor die; and
a plurality of shielding interconnect pads positioned in the first row and in at least one of the second row and the third low, the plurality of shielding interconnect pads positioned radially around a periphery region of the victim interconnect pad and closer to the victim interconnect pad than any of the plurality of interconnects.

* * * * *